(12) United States Patent
Thayer

(10) Patent No.: US 8,554,991 B2
(45) Date of Patent: Oct. 8, 2013

(54) HIGH SPEED INTERFACE FOR DYNAMIC RANDOM ACCESS MEMORY (DRAM)

(75) Inventor: Larry J. Thayer, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 231 days.

(21) Appl. No.: 13/023,991

(22) Filed: Feb. 9, 2011

(65) Prior Publication Data

US 2012/0203961 A1 Aug. 9, 2012

(51) Int. Cl.
*G06F 12/00* (2006.01)
*G11C 5/08* (2006.01)

(52) U.S. Cl.
USPC ....... 711/105; 711/E12.055; 356/66; 356/219

(58) Field of Classification Search
USPC ........................................................ 711/105
See application file for complete search history.

(56) References Cited

U.S. PATENT DOCUMENTS

| 7,409,491 | B2 | 8/2008 | Doblar et al. |
| 7,533,212 | B1 | 5/2009 | Doblar et al. |
| 7,793,043 | B2 | 9/2010 | Blakely et al. |
| 2010/0005376 | A1 | 1/2010 | Laberge et al. |
| 2010/0014364 | A1 | 1/2010 | Laberge et al. |

*Primary Examiner* — Reginald Bragdon
*Assistant Examiner* — Hamdy S Ahmed

(57) ABSTRACT

An interface for a dynamic random access memory (DRAM) includes an interface element coupled to a DRAM chip using a first attachment structure, a first portion of the first attachment structure being used to form a wide bandwidth, low speed, parallel interface, a second portion of the first attachment structure, a routing element and a through silicon via (TSV) associated with the DRAM chip being used to form a narrow bandwidth, high speed, serial interface, the interface element configured to convert parallel information to serial information and configured to convert serial information to parallel information.

14 Claims, 4 Drawing Sheets

HIGH SPEED INTERFACE FOR DYNAMIC RANDOM ACCESS MEMORY (DRAM)

CROSS-REFERENCE TO RELATED APPLICATION

This application is related to co-pending, commonly assigned U.S. patent application Ser. No. 12/712,554, filed on Feb. 25, 2010, entitled "Configurable Memory Sheet And Package Assembly," the entire disclosure of which is hereby incorporated herein by reference.

BACKGROUND

Modern dynamic random access memory (DRAM) devices are typically fabricated using a process that does not allow for efficient high speed input/output (I/O) of data. Similarly, the process used to fabricate a high speed I/O device typically is not optimized for producing a DRAM device. Manufacturers of DRAM devices are finding it increasingly difficult to develop and fabricate an I/O interface that is compatible with emerging DRAM interface standards, such as DDR4 (double data rate version 4), and newer DRAM interface standards, using DRAM fabrication techniques.

Therefore, it would be desirable to have a way of interfacing a modern DRAM device to a modern high speed I/O interface while maximizing both technologies.

SUMMARY

In an embodiment, an interface for a dynamic random access memory (DRAM) comprises an interface element coupled to a DRAM chip using a first attachment structure, a first portion of the first attachment structure being used to form a wide bandwidth, low speed, parallel interface, a second portion of the first attachment structure, a routing element and a through silicon via (TSV) associated with the DRAM chip being used to form a narrow bandwidth, high speed, serial interface, the interface element configured to convert parallel information to serial information and configured to convert serial information to parallel information.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

A high speed interface for a dynamic random access memory (DRAM) element comprises an interface element that makes use of the wide bandwidth, relatively low speed parallel interface associated with a DRAM device and the narrow bandwidth, relatively high speed serial interface associated with a DRAM chip and package to create a high speed I/O interface for a DRAM device.

Figure 1:
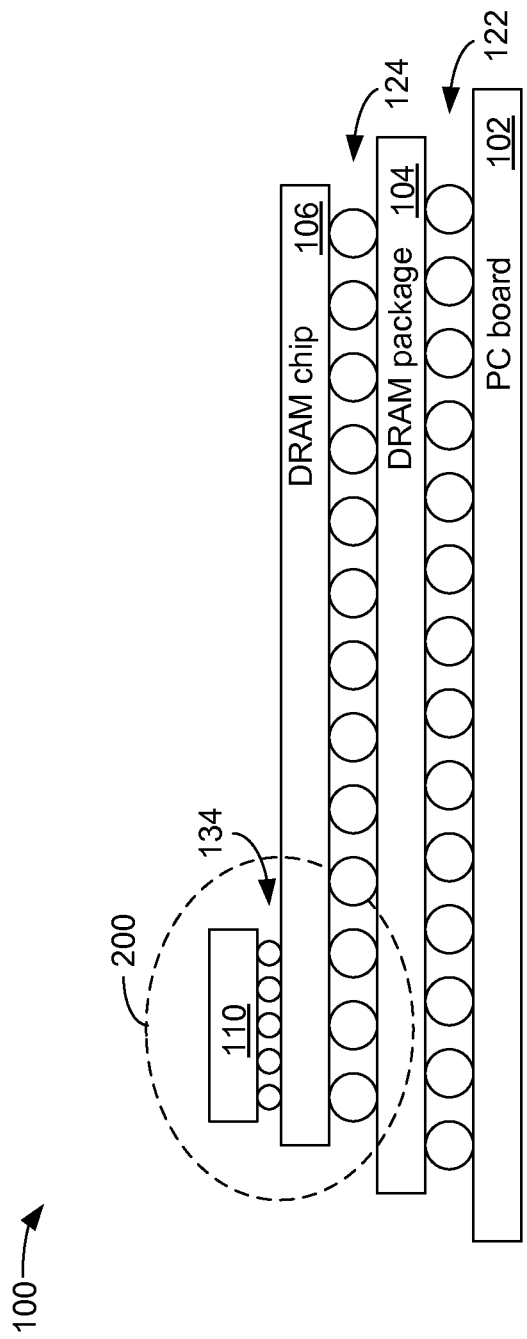
FIG. 1 is a schematic diagram illustrating an assembly including a high speed interface for a dynamic random access memory (DRAM) element.

FIG. 1 is a schematic diagram illustrating an example of an assembly 100 that includes a DRAM circuit. The assembly 100 comprises a printed circuit (PC) board 102 over which a DRAM package 104 is located and attached to the PC board 102 using solder balls 122. The PC board 102 can be any single-layer or multi-layer structure used to mount a circuit package, such as the DRAM package 104 as known in the art. The solder balls 122 are an example of an attachment structure that can be used to electrically and mechanically attach the DRAM package 104 to the PC board 102, and are known to those skilled in the art.

A DRAM circuit element, also referred to as a "DRAM chip" 106 is located and attached to the DRAM package 104 using solder bumps 124. The DRAM chip 106 generally comprises the active memory circuit elements of the DRAM circuitry. The solder bumps 124 are an example of an attachment structure that can be used to electrically and mechanically attach the DRAM chip 106 to the DRAM package 104, and are known to those skilled in the art.

A DRAM interface 110 is located and attached to the DRAM chip 106 using microbumps 134. The DRAM interface 110 can be a silicon-based interface chip that generally uses the wide bandwidth, relatively low speed parallel interface associated with a DRAM device and the narrow bandwidth, relatively high speed serial interface associated with a DRAM chip and package to create a high speed I/O interface for a DRAM device. The size, shape and structure of the microbumps are known to those skilled in the art. In the embodiment shown, the DRAM chip 106 is located over the DRAM package 102, the interface element 110 is located over the DRAM chip 106 and a periphery of the interface element 110 and a periphery of the DRAM chip 106 is contained within a periphery of the DRAM package 104.

Figure 2:
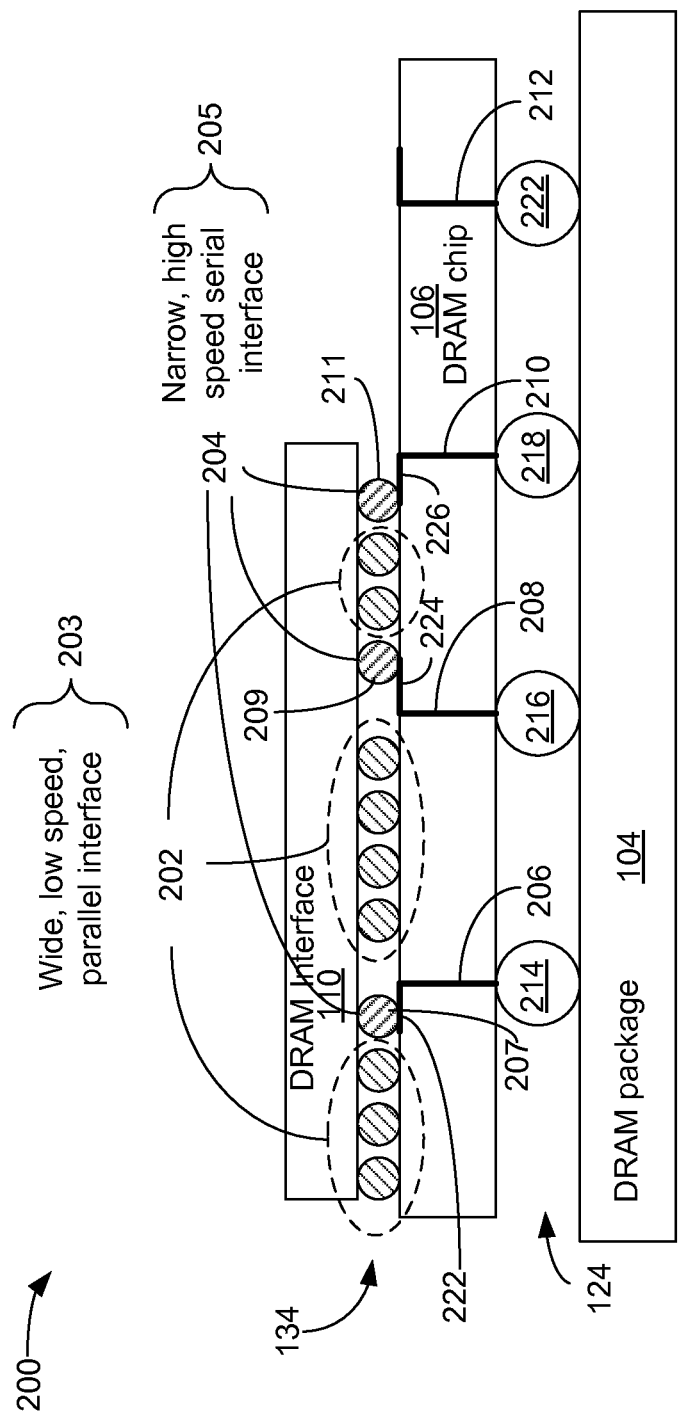
FIG. 2 is a schematic diagram illustrating a portion of the assembly of FIG. 1.

FIG. 2 is a schematic diagram illustrating a portion 200 of the assembly of FIG. 1. The portion 200 generally comprises portions of the DRAM interface 110, DRAM chip 106 and DRAM package 104.

The microbumps 134 can be used to carry two types of interfaces. A portion 202 of the microbumps 134 can be used as part of a wide bandwidth, low speed, parallel interface 203. The interface 203 refers to the interface that is used for signals that are typically internal to the DRAM chip 106. However, the signals that traverse the interface 203 also enter and exit the interface element 110. An example range of speed for the interface 203 can be approximately equal to or greater than 2 gigabits (Gbits) per second.

Another portion 204 of the microbumps 134 can be used as part of a narrow bandwidth, high speed, serial interface 205. The interface 205 refers to the external I/O interface, such as, for example, DDR4, that transfers the internal data, address and power between the DRAM chip 106 and the DRAM package 104. An example range of speed for the interface 205 can be approximately equal to or less than 1 Gbits per second.

An example of part of the narrow bandwidth, high speed, serial interface 205 includes microbump 207, internal DRAM routing trace 222, through silicon via (TSV) 206 that travels through the DRAM chip 106, and, optionally, solder bump 214, that provides a connection to the DRAM package 104. Another example of part of the narrow bandwidth, high speed, serial interface 205 includes microbump 209, internal DRAM routing trace 224, TSV 208 that travels through the DRAM chip 106, and, optionally, solder bump 216 that provides a connection to the DRAM package 104. Similarly, part of the narrow bandwidth, high speed, serial interface 205 includes microbump 211, internal DRAM routing trace 226, TSV 210 that travels through the DRAM chip 106, and, optionally, solder bump 218 that provides a connection to the DRAM package 104.

Figure 3:
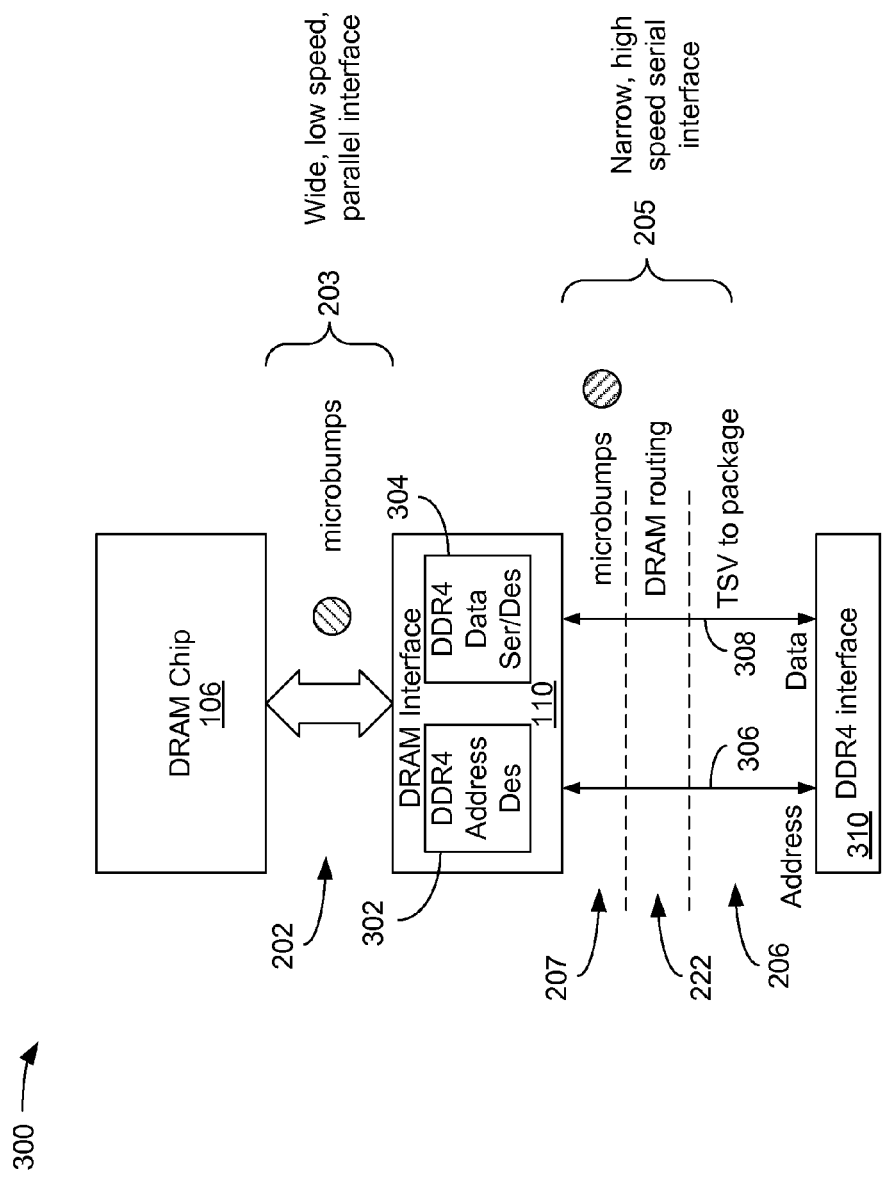
FIG. 3 is a schematic diagram illustrating a conceptual view of the high speed interface for a DRAM.

FIG. 3 is a schematic diagram illustrating a conceptual view 300 of the high speed interface for a DRAM. The DRAM chip 106 is connected to the DRAM interface 110 through the portion 202 of the microbumps 134 that form a part of the wide bandwidth, low speed, parallel interface 203.

The DRAM interface 110 includes an address deserializer 302 and a data serializer/deserializer 304. The address deserializer 302 converts serial address information to parallel address information and the data serializer/deserializer 304 converts serial data to parallel data and converts parallel data to serial data, as known in the art. The address deserializer 302 and the data serializer/deserializer 304 are designed to be compatible with the particular I/O standard employed by the DRAM chip 106 and are shown herein as using the DDR4 interface as an example only.

The DRAM interface 110 is connected to an external I/O interface 310, which is shown as DDR4 as an example only. The interface between the DRAM interface 110 and the DDR4 interface 310 carries address information over connection 306 and data over connection 308. An example of the narrow bandwidth, high speed serial interface 205 uses a portion of the microbumps 204, shown illustratively as the microbump 207, a portion of the DRAM routing, shown illustratively as DRAM routing element 222, and a portion of the TSV to package interface, shown illustratively as TSV 206. The solder bump 214 (FIG. 2) is omitted for ease of illustration.

Figure 4:
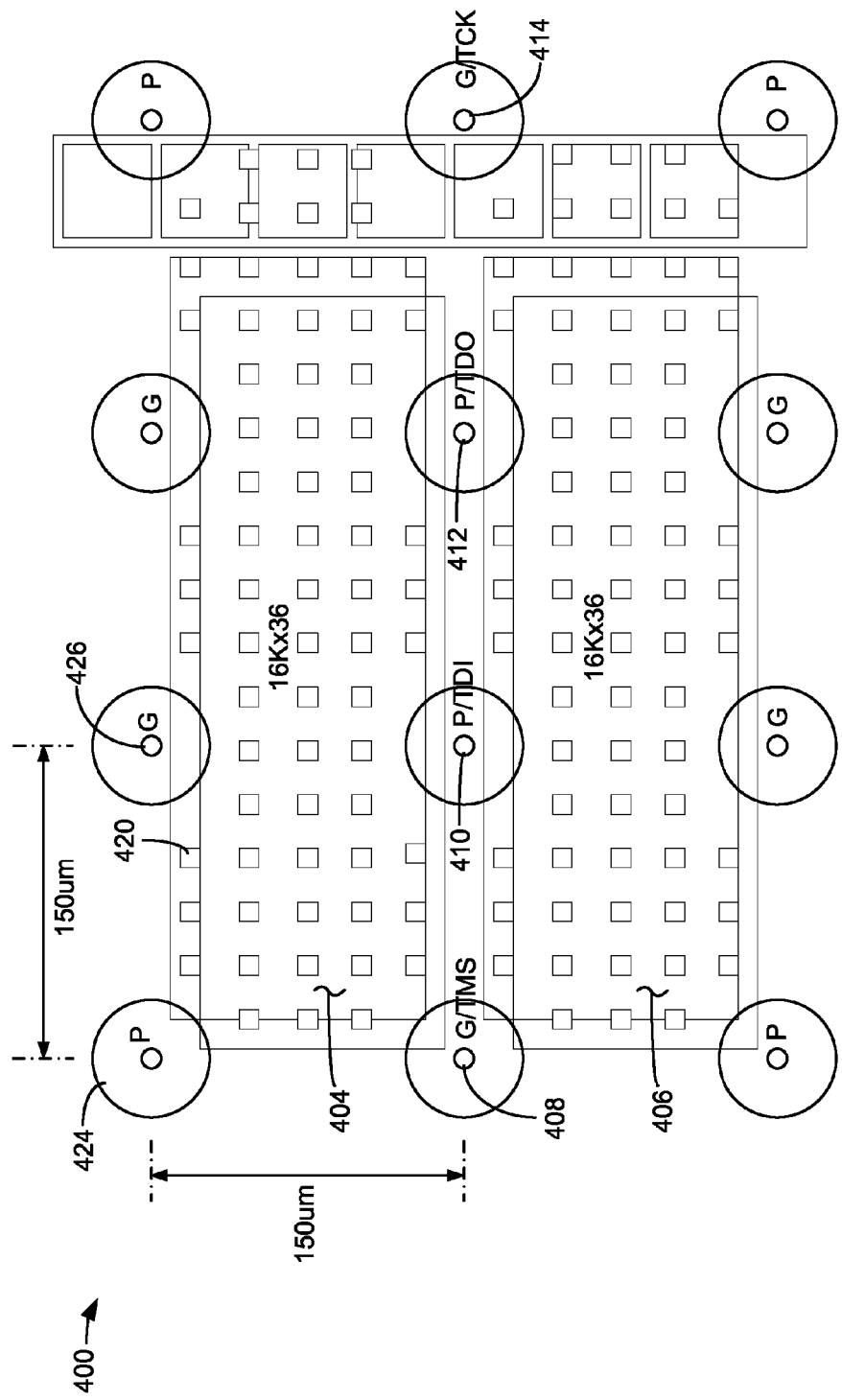
FIG. 4 is a schematic plan view illustrating portions of the high speed interface for a DRAM of FIG. 2.

FIG. 4 is a schematic plan view illustrating portions of the high speed interface for a DRAM of FIG. 2. FIG. 4 shows an exemplary portion of a surface of a DRAM element and is generally referred to as a DRAM bank 400. The DRAM bank 400 can be implemented in a number of ways.

The DRAM bank 400 includes subarray 404 and subarray 406. The number of subarrays in a DRAM bank 400 is arbitrary, and generally driven by design factors. For example, in the embodiment shown herein, the DRAM bank 400 is a memory cell array. In the embodiment shown herein, the DRAM bank 400 is divided into two subarrays, 404, 406, to allow sharing of a row of four TSVs, 408, 410, 412 and 414. The DRAM bank 400 (comprising two subarrays in the example herein) uses a certain number of small interdie signal pads, also referred to herein as micropads, or micro-bond pads 420, to achieve the desired data transfer rate. The micro-bond pads 420 correspond to the microbumps 134 described above. In a particular implementation, it is desirable to provide for a data word that is approximately 72 bits wide. With available DRAM technology, it is possible to fit about 16 k of these words, which use 14 address bits, in the space of the subarrays 404 and 406. Adding 4 control bits, this layout uses about 90 micropads 420. At an example pitch of 25 µm, these micropads 420 would fill the space between a 2×3 array of solder bumps, which can be located on a 150 µm pitch. All of these pads together control and access the full array and are not separately allocated to the subarrays.

It is desirable to balance the number of micropads needed to address the bank at the desired word width against micropad pitch; and to balance the memory density against the solder bump pitch and the number of micropads needed to address the amount of memory thus accommodated.

The subarrays 404 and 406 are illustrated having micro-bond pads 420 to indicate electrical contact from the memory elements within the subarrays 404 and 406 to the top surface of the subarrays 404 and 406, thereby providing connection to the microbump portions of the wide bandwidth, low speed, parallel interface 203 (FIG. 2) and the narrow bandwidth, high speed, serial interface 205 (FIG. 2).

The pads 424 and respective TSVs 426 that supply power and ground are labeled "P" and "G" respectively, in FIG. 4. However, at least a portion of the pads 424 can be used to not only supply power (power and ground) but also to allow the transfer of high speed data and address information using, for example, a high speed interface, such as DDR4.

This disclosure describes the invention in detail using illustrative embodiments. However, it is to be understood that the invention defined by the appended claims is not limited to the precise embodiments described.

What is claimed is:

1. An interface for a dynamic random access memory (DRAM), comprising:
   an interface element coupled to a DRAM chip using a first planar attachment structure comprising microbumps, a first plurality of microbumps in the first planar attachment structure being used to form a wide bandwidth, low speed, parallel interface, a second plurality of microbumps in the first planar attachment structure, a routing element and a through silicon via (TSV) associated with the DRAM chip being used to form a narrow bandwidth, high speed, serial interface, the interface element located over and situated within a periphery of the DRAM chip, the DRAM chip being located over and situated within a periphery of a DRAM package, the interface element configured to convert serial address information to parallel address information, convert serial data to parallel data and convert parallel data to serial data.

2. The interface claim 1, further comprising a DRAM package coupled to the DRAM chip using a second planar attachment structure, the second planar attachment structure forming part of the narrow bandwidth, high speed, serial interface.

3. The interface of claim 1, wherein the interface element further comprises an address deserializer and a data serializer/deserializer.

4. The interface of claim 1, wherein the interface element is compatible with a double data rate 4 (DDR4) interface.

5. The interface of claim 4, wherein the interface element converts the wide bandwidth, low speed, parallel interface to the narrow bandwidth, high speed, serial interface, the narrow bandwidth, high speed, serial interface being compatible with the DDR4 interface.

6. A method for forming an interface for a dynamic random access memory (DRAM), comprising:
   coupling an interface element to a DRAM chip using a first planar attachment structure comprising microbumps, a first plurality of microbumps in the first planar attachment structure being used to form a wide bandwidth, low speed, parallel interface, a second plurality of microbumps in the first planar attachment structure, a routing element and a through silicon via (TSV) associated with the DRAM chip being used to form a narrow bandwidth, high speed, serial interface, the interface element located over and situated within a periphery of the DRAM chip, the DRAM chip being located over and situated within a periphery of a DRAM package; and
   converting serial address information to parallel address information, converting parallel data to serial data and converting serial data to parallel data.

7. The method of claim 6, further comprising coupling a DRAM package to the DRAM chip using a second planar attachment structure, the second planar attachment structure forming part of the narrow bandwidth, high speed, serial interface.

8. The method of claim 6, wherein the interface element further comprises an address deserializer and a data serializer/deserializer.

9. The method of claim 6, wherein the interface element is compatible with a double data rate 4 (DDR4) interface.

10. The method of claim 9, further comprising converting the wide bandwidth, low speed, parallel interface to the narrow bandwidth, high speed, serial interface, the narrow bandwidth, high speed, serial interface being compatible with the DDR4 interface.

11. An integrated circuit structure, comprising:
a dynamic random access memory (DRAM) chip coupled to a DRAM package using solder bumps; and
an interface element coupled to the DRAM chip using a planar array of microbumps; the interface element configured to provide conversion between a wide bandwidth, low speed, parallel interface associated with the DRAM chip and a narrow bandwidth, high speed, serial interface associated with an input/output (I/O) standard, the planar array of microbumps comprising a first plurality of microbumps to form the wide bandwidth, low speed, parallel interface associated with the DRAM chip, and a second plurality of microbumps, a routing element and a through silicon via (TSV) associated with the DRAM chip being used to form the narrow bandwidth, high speed, serial interface associated with an input/output (I/O) standard, the interface element located over and situated within a periphery of the DRAM chip, the DRAM chip being located over and situated within a periphery of a DRAM package.

12. The integrated circuit structure of claim 11, wherein the interface element further comprises an address deserializer configured to convert serial address information to parallel address information and a data serializer/deserializer configured to convert parallel data to serial data and configured to convert serial data to parallel data.

13. The integrated circuit structure of claim 12, wherein the interface element is compatible with a double data rate 4 (DDR4) interface.

14. The integrated circuit structure of claim 13, wherein the interface element converts the wide bandwidth, low speed, parallel interface to the narrow bandwidth, high speed, serial interface, the narrow bandwidth, high speed, serial interface being compatible with the DDR4 interface.

\* \* \* \* \*